United States Patent
Lee et al.

(10) Patent No.: US 7,372,724 B2
(45) Date of Patent: May 13, 2008

(54) METHOD FOR ACCESSING DATA ON MAGNETIC MEMORY

(75) Inventors: Yuan-Jen Lee, Taipei County (TW); Chien-Chung Hung, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/468,302

(22) Filed: Aug. 30, 2006

(65) Prior Publication Data

US 2007/0253241 A1    Nov. 1, 2007

(30) Foreign Application Priority Data

Apr. 28, 2006   (TW) ............................... 95115232 A

(51) Int. Cl.
*G11C 7/00* (2006.01)
(52) U.S. Cl. ...................................... 365/158; 365/173
(58) Field of Classification Search ................ 365/158, 365/173
See application file for complete search history.

(56) References Cited

U.S. PATENT DOCUMENTS

| | | | |
|---|---|---|---|
| 6,545,906 | B1 | 4/2003 | Savtchenko et al. |
| 6,633,498 | B1 | 10/2003 | Engel et al. |
| 2006/0268470 | A1* | 11/2006 | Fukuzawa et al. ....... 360/324.1 |
| 2007/0047158 | A1* | 3/2007 | Hayashi et al. ........ 360/324.11 |
| 2007/0063690 | A1* | 3/2007 | De Wilde et al. ........ 324/117 R |

* cited by examiner

*Primary Examiner*—Michael T Tran
(74) *Attorney, Agent, or Firm*—Jianq Chyun IP Office

(57) ABSTRACT

A method for accessing data on a magnetic memory is provided, wherein the data is accessed in a toggle mode. A first current line and a second current line are used for providing operation currents. The data accessing method includes a data changing operation for changing a data stored in a magnetic memory cell. During a first stage, a current in a first direction is supplied to the first current line, and a current in the first direction is simultaneously supplied to the second current line. During a stage before stopping supplying magnetic field, a current in the first direction is supplied to the first current line, and a current in the first direction is simultaneously supplied to the second current line to offset at least a portion of the biased magnetic field.

16 Claims, 16 Drawing Sheets

(a)

(b) failure (c)

(d) success

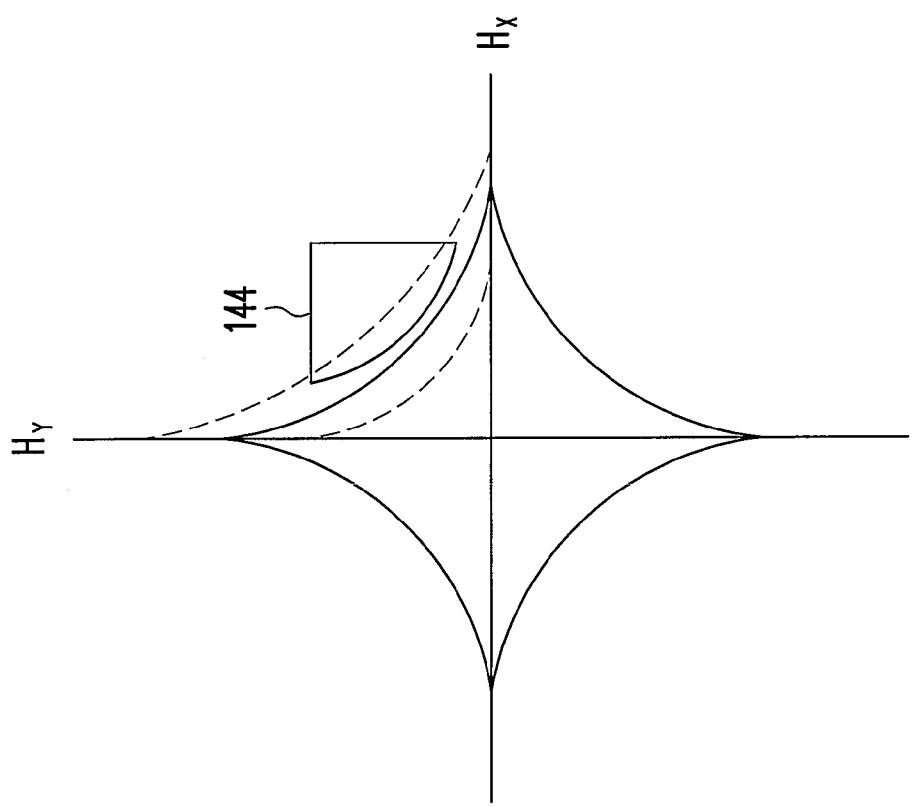
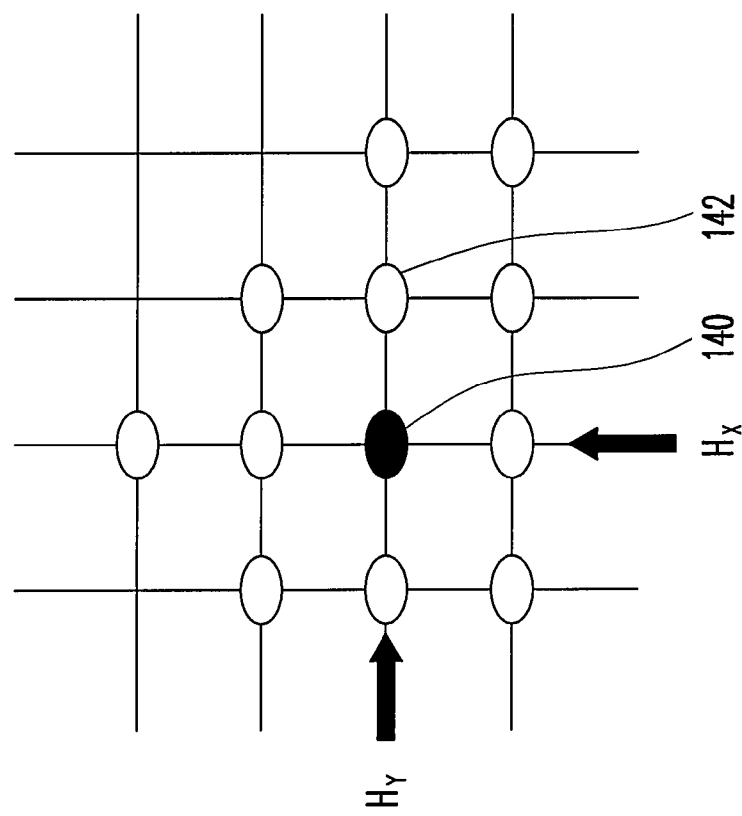
FIG. 4 (PRIOR ART)

(a)
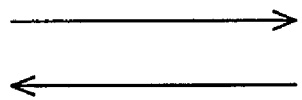
(b)
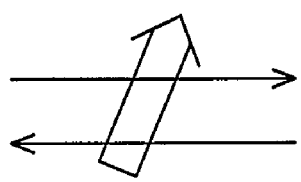
(c)
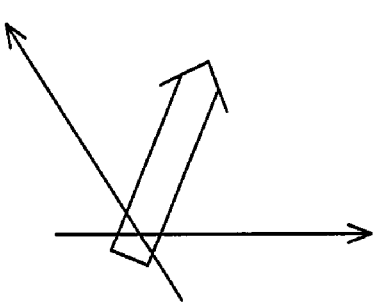
(d)
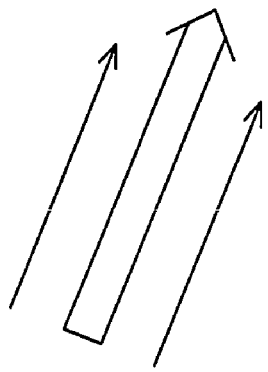
FIG. 7 (PRIOR ART)

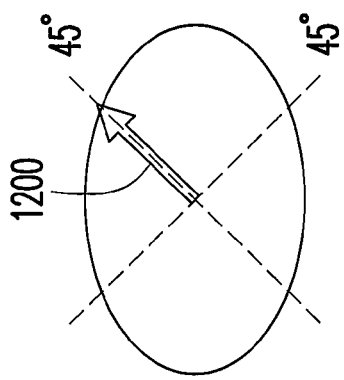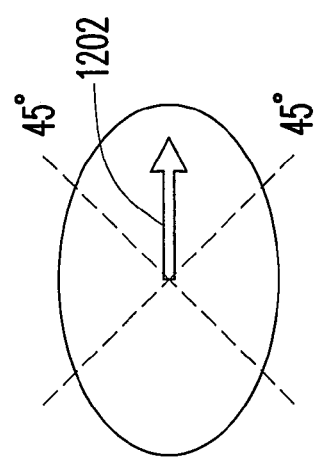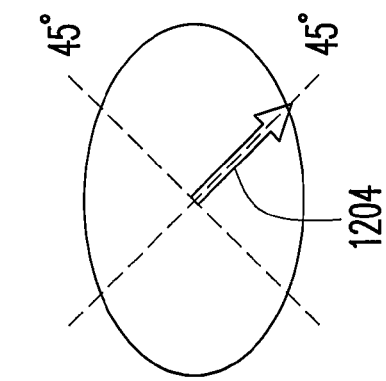
FIG. 12A
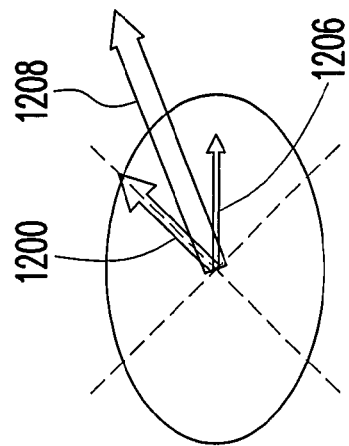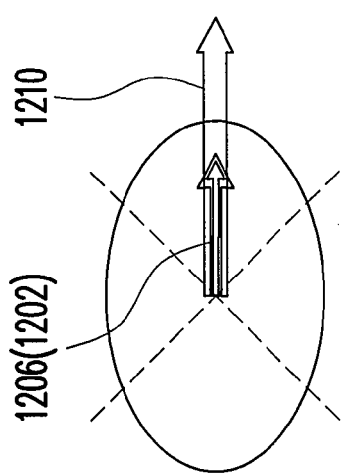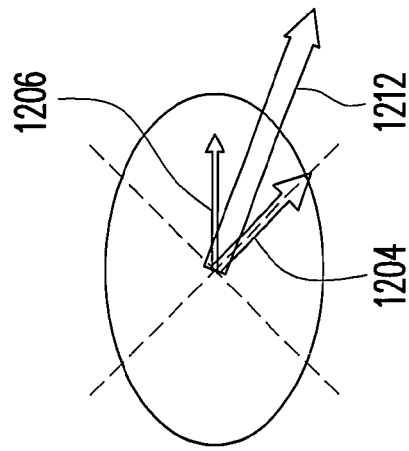
FIG. 12B

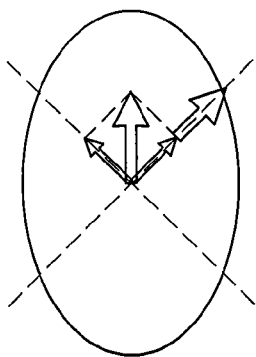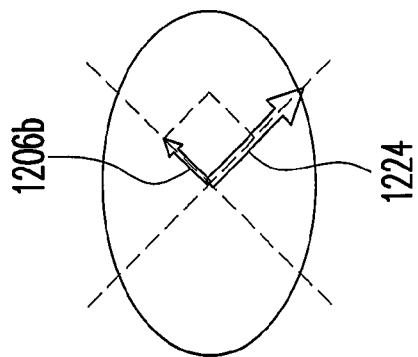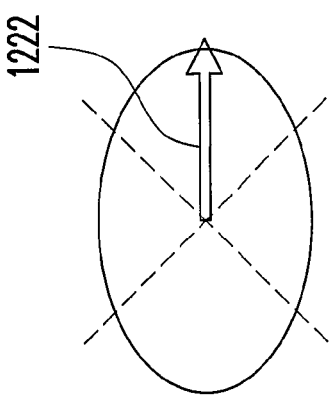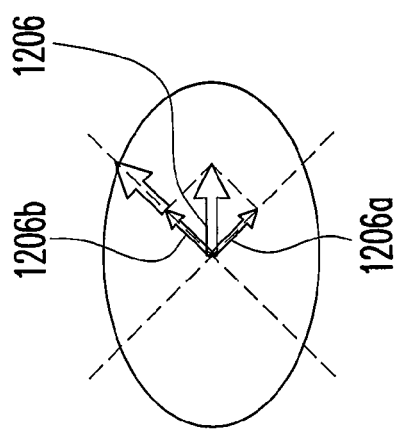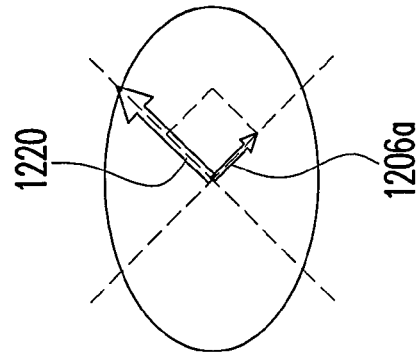
FIG. 13A
FIG. 13B

METHOD FOR ACCESSING DATA ON MAGNETIC MEMORY

CROSS-REFERENCE TO RELATED APPLICATION

This application claims the priority benefit of Taiwan application serial no. 95115232, filed Apr. 28, 2006. All disclosure of the Taiwan application is incorporated herein by reference.

BACKGROUND OF THE INVENTION

1. Field of the Invention

The present invention relates to a magnetic memory technology. More particularly, the present invention relates to an access operation to a magnetic memory cell for accurately reading and changing the data stored in the magnetic memory cell with low operation current.

2. Description of Related Art

Magnetic memory, such as magnetic random access memory (MRAM), is also a kind of non-volatile memory which has such advantages as non-volatility, high density, high read/write rate, and anti-radiation. Data of 0 or 1 is recorded in a magnetic memory through the quantity of the magnetoresistance produced by arranging the magnetizations of the magnetic materials, adjacent to a tunnel barrier insulating layer, in parallel or anti-parallel. When writing data, a magnetic memory cell is selected by crossing the magnetic fields induced by two current lines, such as bit lines (BL) and write word lines (WWL), and the magnetoresistance of the magnetic cell is changed by changing the direction of the magnetization of the free layer. When reading data, a current is passed through the selected magnetic memory cell and the digital memory data can be determined from the resistance of the magnetic memory cell.

FIG. 1 illustrates the basic structure of a magnetic memory cell. Referring to FIG. 1, to access a magnetic memory cell, crossing current lines 100 and 102 with certain currents passing through are used, and the current lines 100 and 102 are referred as, for example, word lines or bit lines, based on the operation manner thereof. The two current lines produce magnetic fields in two directions when currents are passed through the two current lines so that a magnetic field of required magnitude and direction can be obtained and supplied on the magnetic memory cell 104. The magnetic memory cell 104 is of stacked layer structure and includes a magnetic pinned layer having a fixed magnetization or a total magnetic moment in a predetermined direction. The data is read through the magnitude of the magnetoresistance. In addition, the data stored in the memory cell can be read through the output electrodes 106 and 108. The operation details of magnetic memory should be understood by those ordinarily skilled in the art therefore will not be described herein.

FIG. 2 illustrates the storage mechanism of a magnetic memory. In FIG. 2, the magnetic pinned layer 104a has a fixed magnetic moment direction 107. The magnetic free layer 104c is disposed above the magnetic pinned layer 104a, and the two layers are isolated by an insulating layer 104b. The magnetic free layer 104c has a magnetic moment direction 108a or 108b. If the magnetic moment direction 108a is parallel to the magnetic moment direction 107, the magnetoresistance produced denotes, for example, a binary data "0"; otherwise if the magnetic moment direction 108b is anti-parallel to the magnetic moment direction 107, the magnetoresistance produced denotes, for example, the binary data "1".

FIG. 3 illustrates the relationship between the magnetoresistance (R) and the applied magnetic field (H) of a magnetic memory cell. The real line represents the magnetoresistance line of a single magnetic memory cell. However, a magnetic memory device may include a plurality of memory cells, and the magnitude of the reverse field of each memory cell may be different, thus, the magnetoresistance curve may be like the dotted line, which may result in access error. FIG. 4 illustrates the array structure of a conventional memory cell. The left diagram in FIG. 4 illustrates an array structure, for example, data is written into the memory cell 140 by supplying magnetic fields Hx and Hy in two directions. The right diagram illustrates the asteroid curve of the free layer. Within the real line area, the magnetization direction of the memory cell 140 will not be switched because the magnetic field is small. The magnetic field in a limited area outside the real line area is a suitable reversing magnetic field for reversing operation. The adjacent memory cell will be interfered if the magnetic field is too large, so large magnetic field is not suitable to be used. Thus, generally the magnetic field in the operation area 144 is serving as the operating magnetic field. However, since the other memory cells 142 will also sense the magnetic field supplied, the supplied magnetic field may also change the data stored in other memory cells 142 due to the change of the operating conditions of the adjacent memory cells 142. Accordingly, access error may be caused to the single free layer 104c in FIG. 2.

To resolve the foregoing problems, a magnetic free stacked layer 166 having FM/M/FM three layers structure is used to replace the single layer of ferromagnetic material in U.S. Pat. No. 6,545,906 to reduce interference to the adjacent memory cells when writing data, as shown in FIG. 5, and the two ferromagnetic metal layers 150 and 154 above and below the non-magnetic metal layer 152 are anti-parallel to each other to form a close flux. The magnetic pinned stacked layer 168 at the bottom is isolated from the magnetic free stacked layer 166 by a tunnel barrier layer (T) 156. The magnetic pinned stacked layer 168 includes a top pinned layer (TP) 158, a non-magnetic metal layer 160, and a bottom pinned layer (BP) 162. The top pinned layer and the bottom pinned layer have fixed magnetizations. In addition, a base layer 164, for example, an anti-ferromagnetic layer, is disposed at the bottom.

As to the magnetic free stacked layer 166 of three-layer structure, the magnetic anisotropic axes of the first and the second write lines corresponding to the free stacked layer 166 form an including angle of 45°, and the direction of the magnetic anisotropic axis thereof is the direction of easy axis. Accordingly, the first and the second write lines can respectively supply a magnetic field having an angle of 45° from the easy axis to the free stacked layer 166 successively, so as to rotate the magnetization of the free stacked layer 166. FIG. 6 illustrates the timing of supplying magnetic fields. In FIG. 6, the top diagram illustrates the relative direction of the easy axis (denoted by the double-arrow) to the magnetic field. The bottom diagram illustrates the timing of supplying currents to the first and the second write lines. Wherein, current $I_1$ represents that a magnetic field in 45° to the easy axis will be produced, namely, the perpendicular axis in the top diagram, and current $I_2$ represents that a magnetic field in −45° to the easy axis will be produced, namely, the horizontal axis in the top diagram. The magnetization directions of the two ferromagnetic layers 150 and 154 of the free stacked layer 166 are reversed in direction based on the timing of supplying the currents. This timing of current supplying is accomplished with two stages, thus, the operation is also referred to as toggle mode operation. The magnetization directions of the two ferromagnetic layers 150 and 154 of the free stacked layer 166 are reversed once after each toggle mode operation. Since the magnetization direction of the top pinned layer 158 is fixed, the magnetization direction of the bottom ferromagnetic layer 154 may be parallel or anti-parallel to the magnetization direction of the top pinned layer 158, so that a binary data can be stored.

FIG. 7 illustrates the correspondence of the magnetizations on the two ferromagnetic layers 150 and 154 of the free stacked layer 166 to the magnitude of the external magnetic field. Referring to FIG. 7, in situation (a), the thin arrows represent the magnetization directions of the two ferromagnetic layers 150 and 154 of the free stacked layer 166. In situation (b), the two magnetization directions are not changed when the external magnetic field H (bold arrow) is small. The two magnetization directions reach a balance with the magnetic field H when the external magnetic field H is increased to a certain value, so that an opening angle is formed, here the range of the magnetic field is the toggle operation area in toggle mode, and the rotation of the magnetization thereof is by changing two magnetic fields perpendicular to each other based on a particular timing (referring to FIG. 6). Accordingly, the magnetization is rotated stage by stage. However, the two magnetization directions are always led to the same direction of the magnetic field H if the magnetic field H is too large, which is not an appropriate operation area.

FIG. 8 illustrates the reversing mechanism of supplying the magnetic field produced by the operation current in FIG. 6 to a memory cell. Referring to FIG. 8, during time section $t_0$, no magnetic field is supplied, thus, the two magnetizations on the two free layers are anti-parallel to each other. During time section $t_1$, a magnetic field $H_1$ in 45° to the easy axis is supplied to the free stacked layer. Here the two magnetizations are rotated based on the direction of the magnetic field supplied. During time section $t_2$, a magnetic field $H_2$ is supplied at the same time. The direction of the magnetic field $H_2$ forms an angel of −45° to the easy axis. Thus, if the magnitudes of the two magnetic fields are the same, the direction of the total magnetic field is on the easy axis. Here the two magnetizations are rotated again. Next, during time section $t_3$, it stops supplying the magnetic field $H_1$. Here the total magnetic field is supplied by the magnetic field $H_2$, so that the two magnetizations are rotated again. It should be noted that during time section $t_3$ the two magnetizations have been approximately reversed corresponding to the easy axis. Accordingly, during time section $t_4$, the two magnetizations return to the direction of the easy axis in anti-parallel status when the external magnetic field disappears, so that the two magnetizations are reversed.

FIG. 9 illustrates the operating areas corresponding to external magnetic fields. Referring to FIG. 9, the operation area on the magnetic field coordinate corresponding to the toggle operation mode in FIG. 8 is toggle area 97. There are also non-switching area 92 and direct area 95. The direct area 95 is disposed between the non-switching area 92 and the toggle area 97 and the details thereof are not described herein.

The U.S. Pat. No. 6,633,498 provides a design for reducing operation magnetic field. FIG. 10 illustrates the design of reducing operation magnetic field. Referring to FIG. 10, the conventional design is to adjust the magnitudes of the total moments 170 and 172 of the top pinned layer 158 and the bottom pinned layer 162 of the magnetic pinned stacked layer so as to produce a leakage magnetic field. The leakage magnetic field will produce a biased magnetic field $H_{BIAS}$ to the free stacked layer, as shown in the figure. The starting point of the toggle operation area is closer to the magnetic field zero. Wherein, the magnitudes of the magnetic moments can be adjusted by simply adjusting the thicknesses of the pinned layers.

In the conventional technology described above, the magnetic field $H_{BIAS}$ can not be increased unlimitedly. According to the research of the present invention, in the conventional technology, if the biased magnetic field $H_{BIAS}$ is too strong, at least the data stored in the memory cell is directly interfered, which may cause data access failure.

SUMMARY OF THE INVENTION

Accordingly, the present invention is directed to provide a method for accessing data in a magnetic memory, wherein the data is accessed in toggle mode to reduce access failure rate under large biased magnetic field, accordingly the data can be accessed successfully with low current.

The present invention provides a method for accessing data in a magnetic memory, and the method is suitable for accessing data in a magnetic memory cell of a magnetic memory device in toggle mode. The magnetic memory device has a first current line and a second current line, wherein a positive current passing through the first current line produces a magnetic field in the direction of +45°, and a positive current passing through the second current line produces a magnetic field in the direction of −45°. The data accessing method includes a data changing operation for changing a data stored in the magnetic memory cell. The data changing operation includes simultaneously supplying a current in a first direction to the first current line and a current in the first direction to the second current line to offset at least a portion of the biased magnetic field during a first stage. A reversing operation is performed to reverse a magnetization of the magnetic free stacked layer.

According to the data accessing method in an embodiment of the present invention, the reversing operation includes simultaneously supplying a current in a second direction to the first current line and a current in the first direction to the second current line during a second stage. During a third stage, a current in the second direction is supplied to the first current line and a current in the second direction is simultaneously supplied to the second current line. During a fourth stage, a current in the first direction is supplied to the first current line and a current in the second direction is simultaneously supplied to the second current line. During a fifth stage, a current in the first direction is supplied to the first current line and a current in the first direction is simultaneously supplied to the second current line. Wherein the foregoing first and second directions are opposite to each other.

According to the data accessing method in an embodiment of the present invention, the first direction is a positive current direction or a negative current direction.

According to the data accessing method in an embodiment of the present invention, the magnetic memory cell is not supplied with external magnetic field before the first stage and after the fifth stage.

According to the data accessing method in an embodiment of the present invention, a total magnetic field supplied to the magnetic memory cell substantially offsets a portion of the biased magnetic field during the first stage or the fifth stage.

According to an embodiment of the present invention, in the foregoing reversing operation, a current in the first direction is supplied to the first current line and a current in the first direction is simultaneously supplied to the second current line to offset at least a portion of the biased magnetic field during the stage before stopping supplying the magnetic field.

The present invention further provides a method for accessing data in a magnetic memory which is suitable for accessing data in a magnetic memory cell of a magnetic memory device in a toggle mode. The magnetic memory device has a first current line and a second current line, wherein a positive current passing through the first current line produces a magnetic field in the direction of +45°, and a positive current passing through the second current line produces a magnetic field in the direction of −45°. The data accessing method includes a writing operation for writing a data into the magnetic memory cell, which includes simultaneously supplying a current in a first direction to the first current line and a current in the first direction to the second current line during the first stage. A current data stored in the magnetic memory cell is read from the magnetic memory cell, wherein if the data to be written is the same as the current data, stop supplying the currents, and if the data to be written is different from the current data, continue to following steps. During the second stage, a current in the second direction is supplied to the first current line and a current in the first direction is simultaneously supplied to the second current line. During the third stage, a current in the second direction is supplied to the first current line and a current in the second direction is simultaneously supplied to the second current line. During the fourth stage, a current in the first direction is supplied to the first current line and a current in the second direction is simultaneously supplied to the second current line. During a fifth stage, a current in the first direction is supplied to the first current line and a current in the first direction is simultaneously supplied to the second current line. Wherein, the first and the second directions are opposite to each other.

The present invention further provides another method for accessing data in a magnetic memory, and the method is suitable for accessing data in a magnetic memory cell of a magnetic memory device in a toggle mode. The magnetic memory device has a first current line and a second current line, wherein a positive current passing through the first current line produces a magnetic field in the direction of +45°, and a positive current passing through the second current line produces a magnetic field in the direction of −45°. The data accessing method includes a reading operation for reading a data stored in the magnetic memory cell. The reading operation includes simultaneously supplying a current in a direction to the first current line and a current in the direction to the second current line. Wherein a total magnetic field produced by these currents is used for offsetting at least a portion of the biased magnetic field. The data presently stored in the magnetic memory cell is read.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 illustrates the array structure of a conventional memory cell.

FIG. 7 illustrates the correspondence of the magnetizations on the two ferromagnetic layers 150 and 154 of the free stacked layer 166 to the magnitude of the external magnetic field.

FIGS. 12A-12B illustrate the relationship between a biased magnetic field and an external magnetic field.

FIGS. 13A-13B illustrate the difference between the directions of a biased magnetic field and an ideal magnetic field.

DESCRIPTION OF EMBODIMENTS

Figure 1:
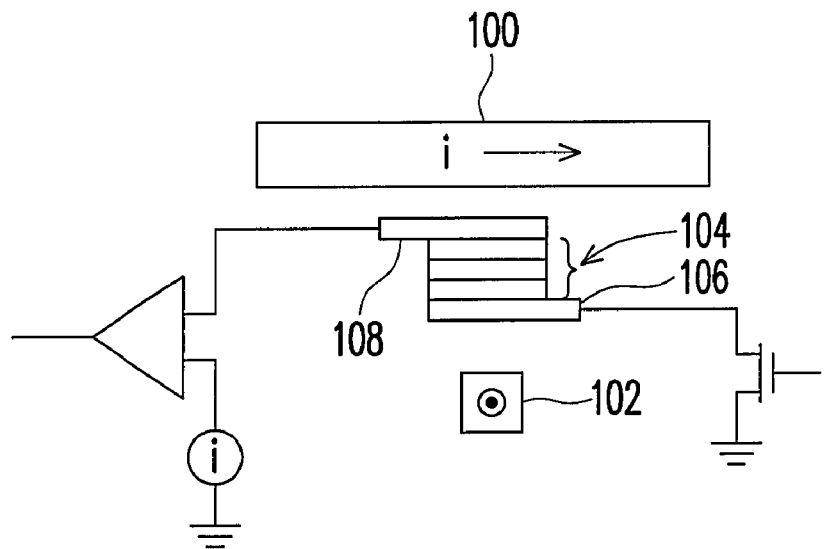
FIG. 1 illustrates the basic structure of a magnetic memory cell.
Figure 2:
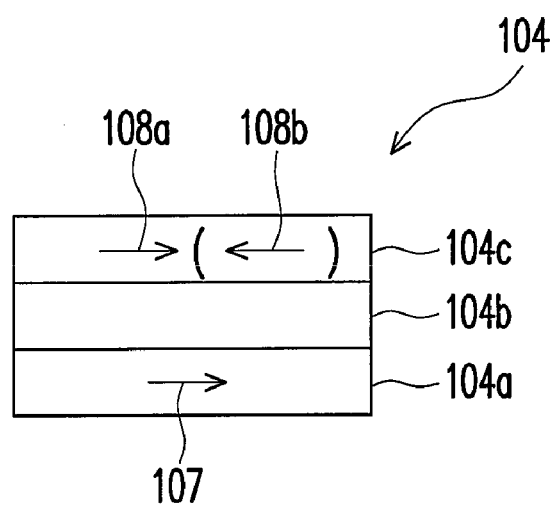
FIG. 2 illustrates the storage mechanism of a magnetic memory.
Figure 3:
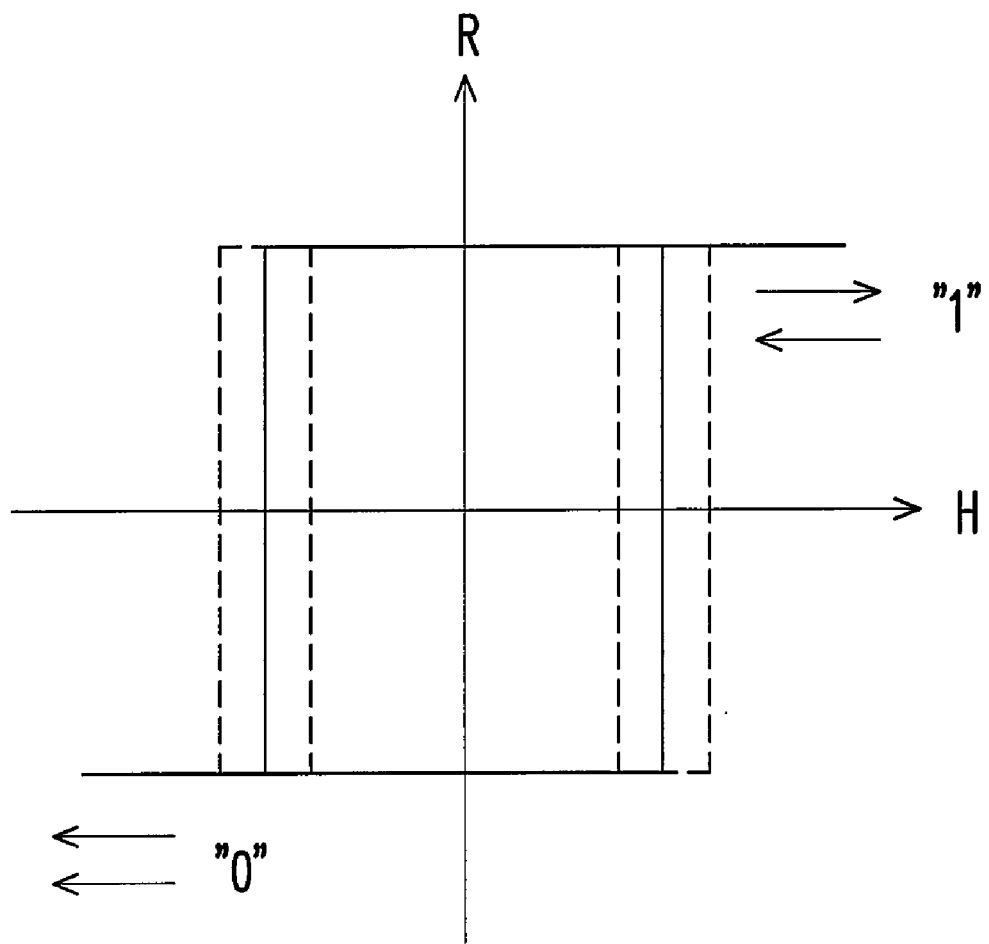
FIG. 3 illustrates the relationship between the magnetoresistance (R) and the magnetic field (H) of a magnetic memory cell.
Figure 5:
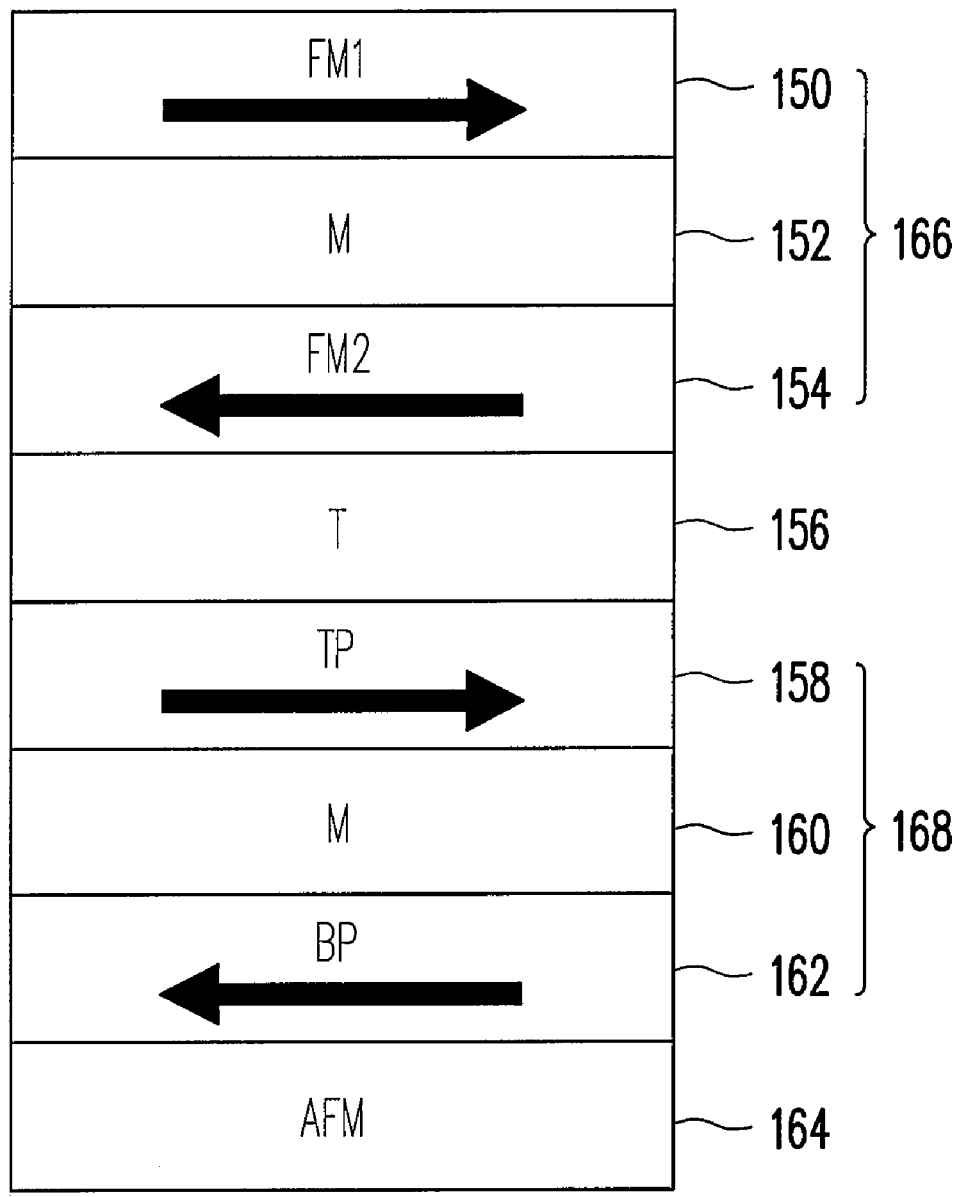
FIG. 5 illustrates the basic structure of a conventional memory cell.
Figure 6:
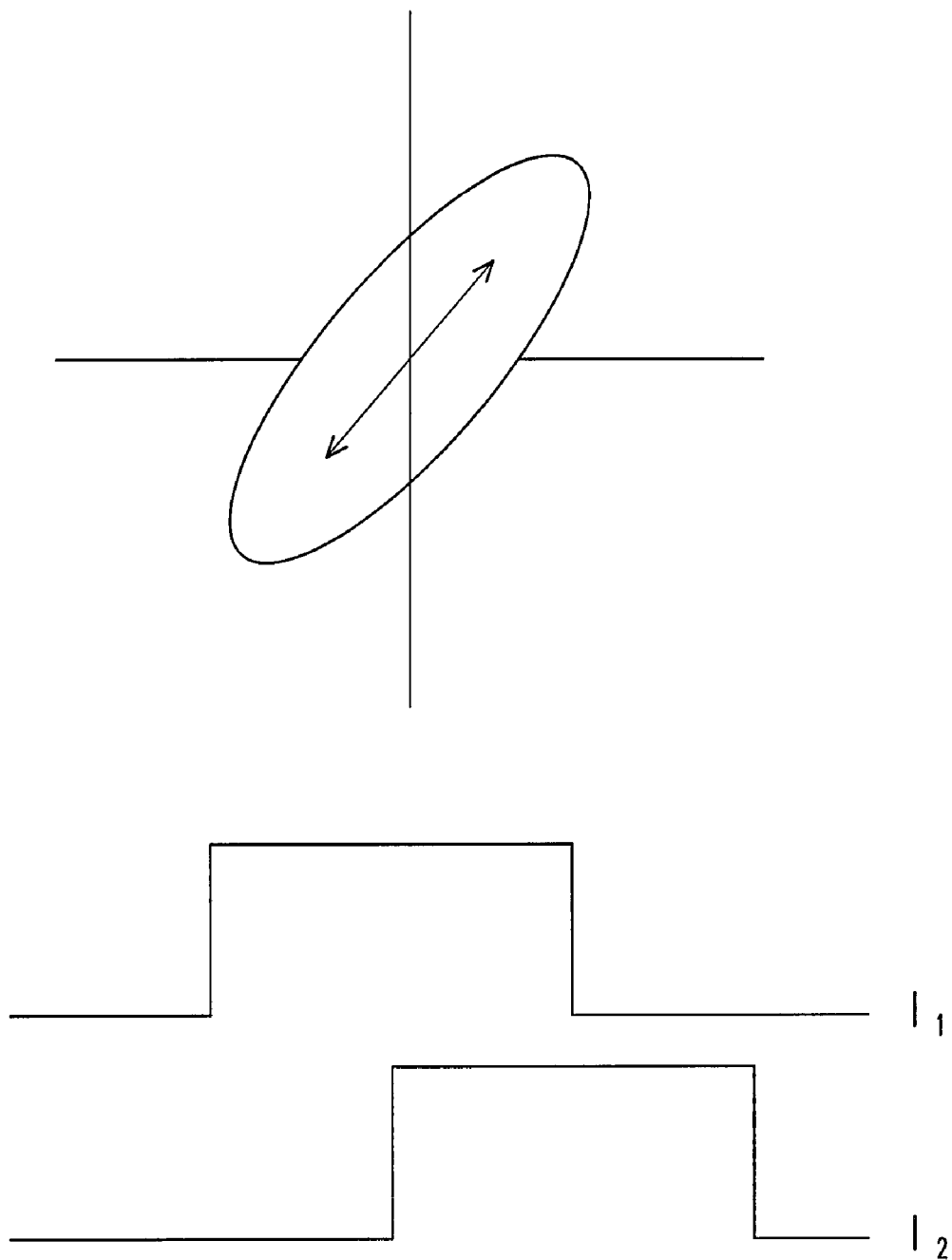
FIG. 6 illustrates the timing of supplying magnetic fields.
Figure 8:
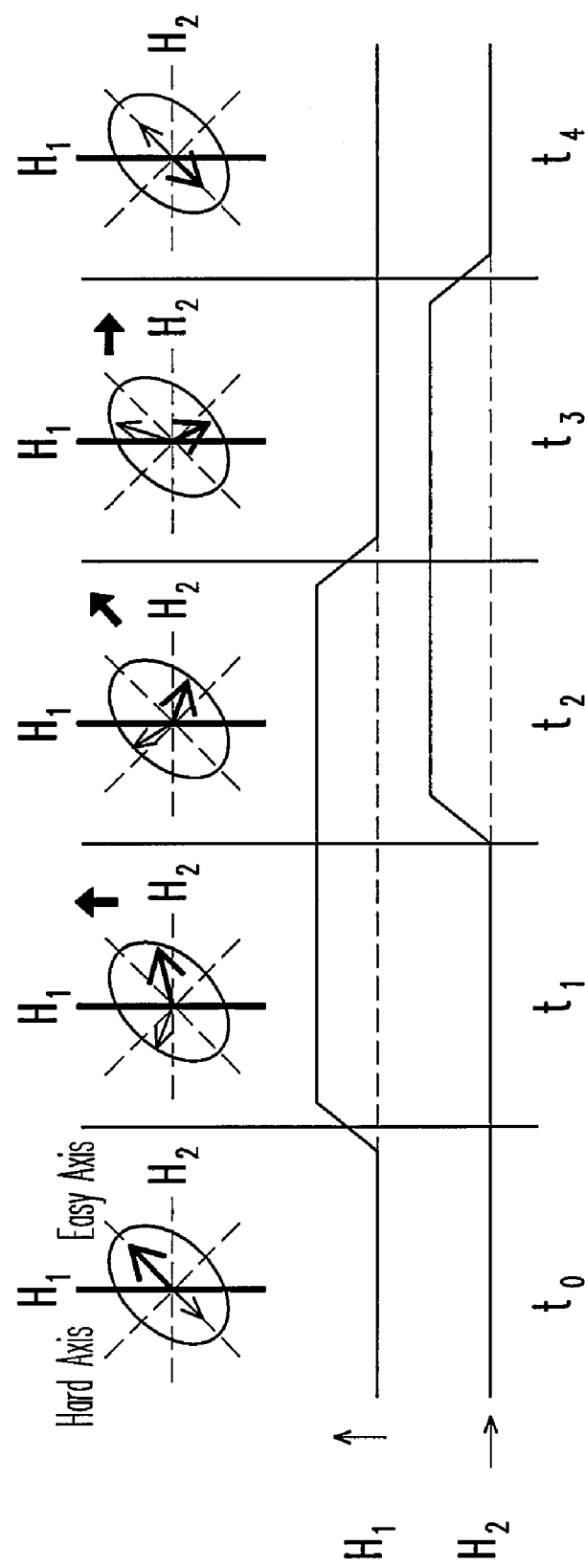
FIG. 8 illustrates the reversing mechanism of supplying the magnetic field produced by the operation current in FIG. 6 to a memory cell.
Figure 9:
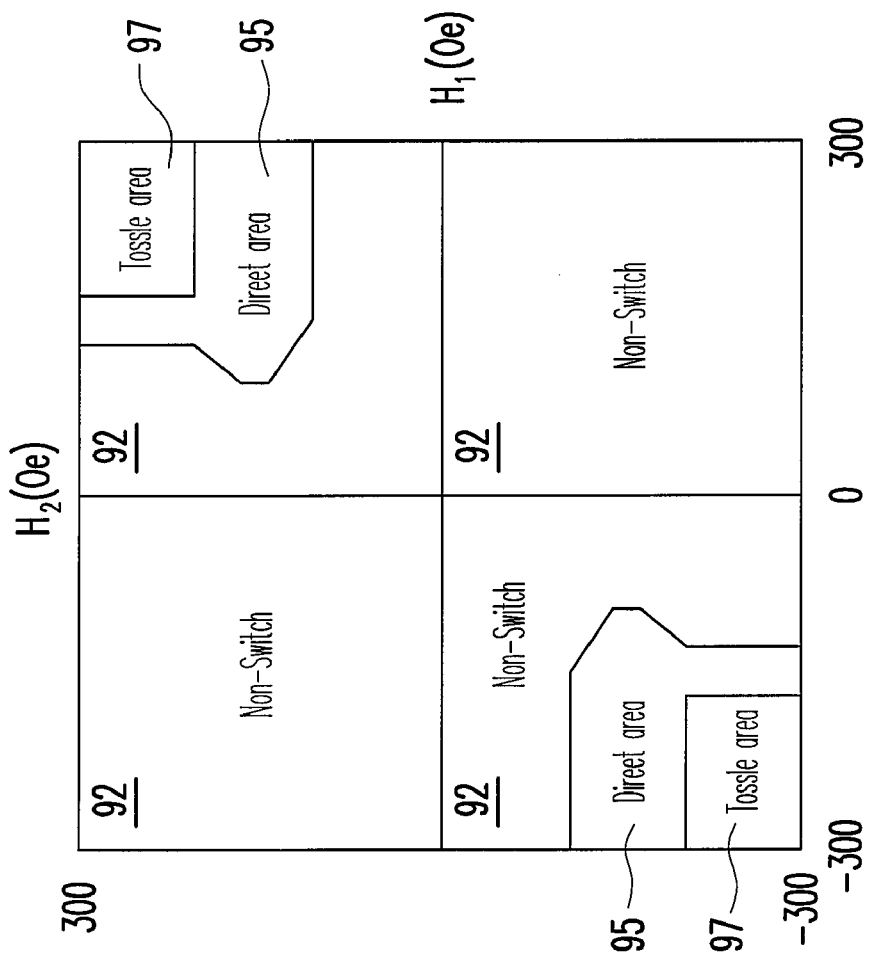
FIG. 9 illustrates the operating areas of two magnetizations on two free layers in relative to the external magnetic field.
Figure 10:
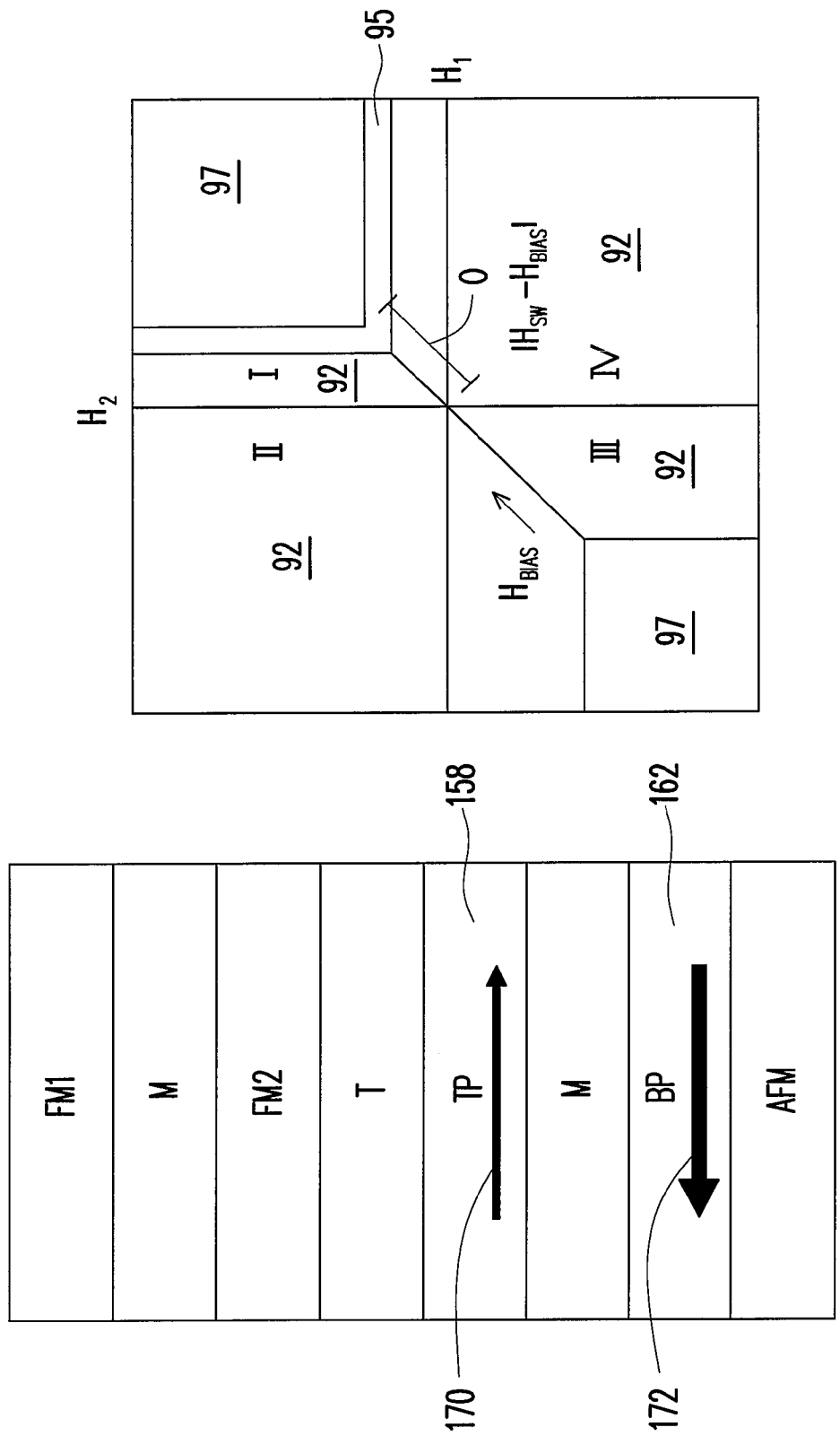
FIG. 10 illustrates the design of reducing operating magnetic field.
Figure 11:
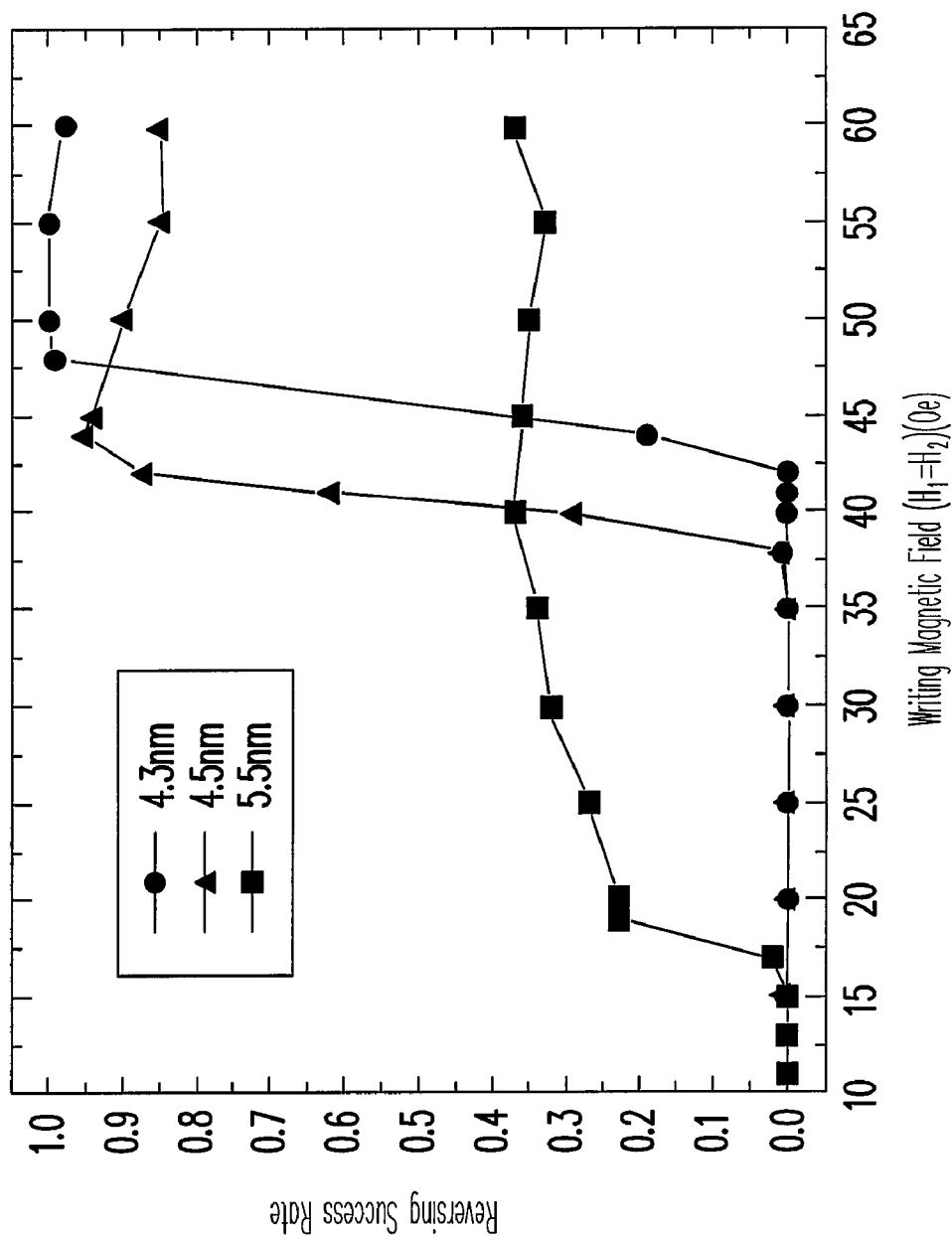
FIG. 11 illustrates the success rate of reversing the magnetization of the free layer by changing the thickness of the bottom pinned layer 162 in FIG. 10.

In the present invention, the thickness of the bottom pinned layer 162 in FIG. 10 is changed to simulate the success rate of reversing the magnetization of the free layer, and the result is as shown in FIG. 11. Referring to FIG. 11, the data with round dots represent the situation when the thickness of the bottom pinned layer 162 is 4.3 nm. In addition, the data with triangle dots represent the situation when the thickness of the bottom pinned layer 162 is 4.5 nm, and the data with rectangle dots represent the situation when the thickness of the bottom pinned layer 162 is 5.5 nm. The thicker the bottom pinned layer 162 is, the larger the biased magnetic field is. Corresponding to the writing operation magnetic field in FIG. 6, when $H_1=H_2$, the magnitude of one of the magnetic fields is the abscissa. Wherein, the thickness 3.0 nm of the top pinned layer 158 is used as a reference thickness. According to the distribution of the round dots, a pair of magnetic moments of the free stacked layer can be successfully reversed when the magnetic field is about 48 Oe, and the reversing success rate thereof can be maintained favorable. When the thickness of the bottom pinned layer 162 is increased, as the distribution of the triangle dots, the operating magnetic field is reduced, and the reversing success rate can also be maintained within an acceptable range. When the thickness of the bottom pinned layer 162 is further increased to 5.5 nm, even though a stronger biased magnetic field is produced to reduce the magnetic field required for reversing, which is about 17 Oe, however, the reversing success rate thereof is no more than 40%, as the distribution of the rectangle dots. Thus, the thickness of the bottom pinned layer 162 has a threshold, and the device cannot operate properly if the thickness of the bottom pinned layer 162 exceeds the threshold.

The possible resolution is further researched in the present invention to resolve the problem described above. FIGS. 12A-12B illustrate the relationship between a biased magnetic field and an external magnetic field. Referring to FIG. 12A, since magnetic fields are vectors which can be added together, the direction denoted by the dashed line represents the direction of three magnetic fields 1200, 1202, and 1204 supplied during three time sections $t_1$-$t_3$ in relative to the direction of easy axis, which is the including 45°. Referring to FIG. 12B, the leakage magnetic field on the pinned stacked layer of the memory cell supplies a biased magnetic field 1206 to the free stacked layer. Thus, the total magnetic fields during the three time sections $t_1$-$t_3$ are respectively 1208, 1210, and 1212. Obviously, the total magnetic fields 1208 and 1212 in $t_1$ and $t_3$ are not in the ideal direction, which is one of the possible reasons of reversing failure.

After the possible reason has been found out, the present invention continues to analyze the mechanism thereof to find out the resolution. FIGS. 13A-13B illustrate the difference between the directions of a biased magnetic field and an ideal magnetic field. Referring to FIG. 13A, The biased magnetic field 1206 is divided into two vector components 1206a and 1206b in the directions of 45°, wherein only one of the vector components 1206a and 1206b will shift the direction of the total magnetic field. Referring to FIG. 13B, since the vector component 1206b is in the ideal direction during time section $t_1$ (the left diagram), thus, the actually expected operating magnetic field can be reduced, that is, the write current can be reduced, however, the effective magnetic field 1220 substantially obtained in the direction of 45° is still large enough. So the problem to be considered is simplified into that how to overcome the extra vector component 1206a. Since the biased magnetic field is in the direction of the easy axis during time section $t_2$ (the middle diagram), the effective magnetic field 1222 is obtained. While during time section $t_3$ (the right diagram), the situation is similar to that in time section $t_1$ that the extra vector component 1206b has to be resolved to obtain the effective magnetic field 1224.

Figure 14:
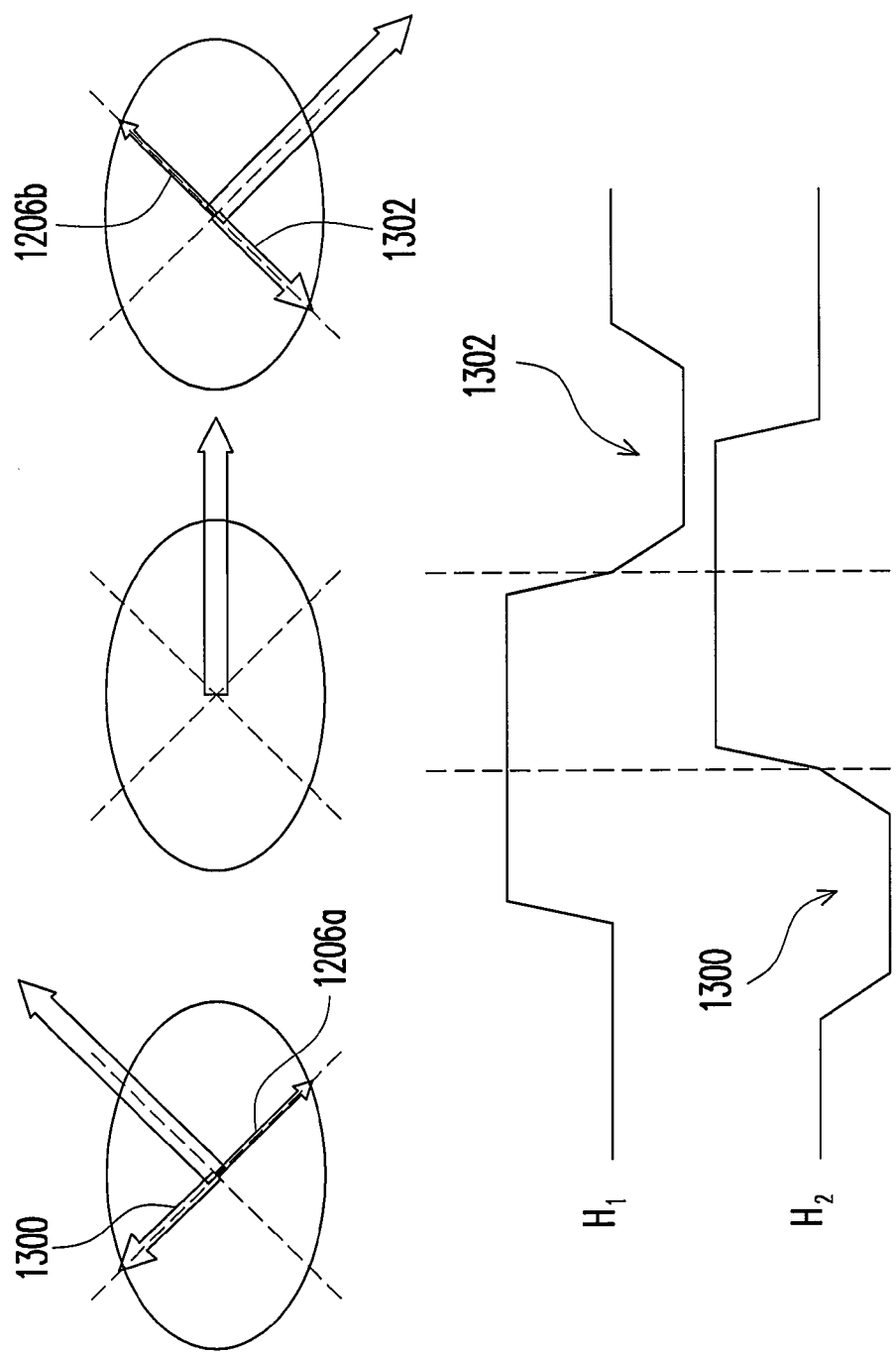
FIG. 14 illustrates the mechanism of resolving the operating magnetic field of extra vector component.

FIG. 14 illustrates the mechanism of resolving the operating magnetic field of an extra vector component. Referring to FIG. 14, during time section $t_1$, since the extra vector component 1206a is on the dashed line of 45°, the extra vector component 1206a corresponds to the control of the magnetic field $H_2$. Accordingly, as to the operation to the magnetic field $H_2$, a reversed magnetic field 1300 may be produced first in timing, that is, a reversed current is supplied first. Thus, the reversed magnetic field 1300 can at least offset a portion of the vector component 1206a. Preferably, the vector component 1206a is offset. Similarly, during time section $t_3$, the reversed magnetic field 1302 can at least offset a portion of the vector component 1206b. Preferably, the vector component 1206b is offset. The operation in FIG. 14 is also referred to as dual negative pulse operation.

Figure 15:
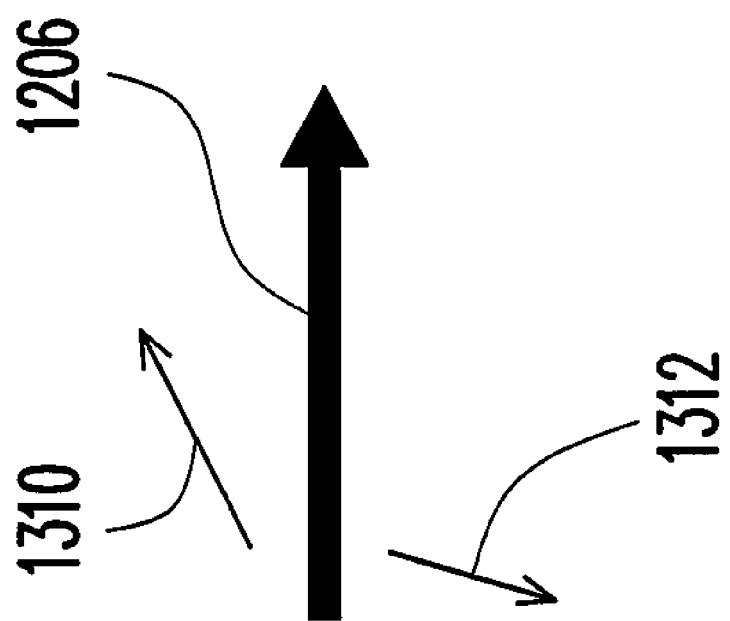
FIG. 15 illustrates another aspect of the present invention.

FIG. 15 illustrates another aspect of the present invention. Referring to FIG. 15, if the biased magnetic field 1206 is too large, the magnetizations 1310 and 1312 of the free layer can be affected by the biased magnetic field 1206. To reach a balance, the magnetizations 1310 and 1312 have been affected by the biased magnetic field 126 so as to form an angle. Since the magnetizations 1310 and 1312 have been rotated before supplying the operating magnetic field, reversing failure may occur. Furthermore, the magnetizations 1310 and 1312 may not be rotated as expected in toggle mode operation if the magnetizations 1310 and 1312 of the free layer have been already a deviation during manufacturing period, causing access error.

Figure 16:
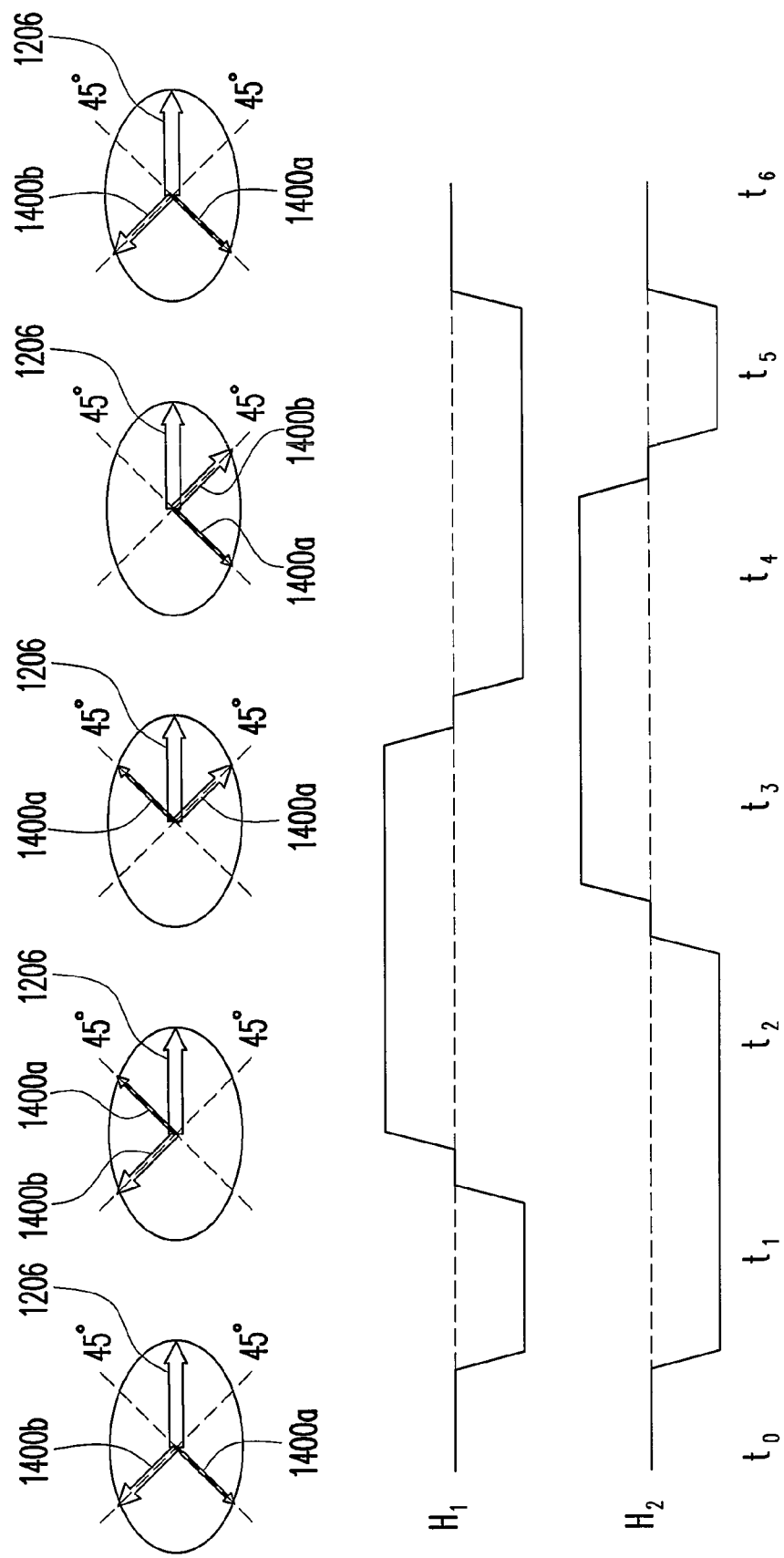
FIG. 16 illustrates the operation of accessing full negative pulse according an embodiment of the present invention.

FIG. 16 illustrates the operation of accessing full negative pulse according an embodiment of the present invention. Referring to FIG. 16, in a reversing operation, the memory cell is not supplied with any external magnetic field during time section $t_0$. The top diagram of FIG. 16 illustrates the direction of the magnetic field corresponding to the direction of the biased magnetic field 1206 in time sections $t_1$-$t_5$. The magnetic field $H_1$ is the timing relationship of supplying the writing magnetic field 1400a, and the magnetic field $H_2$ is the timing relationship of supplying the writing magnetic field 1400b. To avoid the affection of the biased magnetic field 1206, the writing magnetic fields 1400a and 1400b are supplied in two 45° directions during time section $t_1$ for offsetting at least a portion of the biased magnetic field 1206, or preferably, substantially offsetting the biased magnetic field 1206. The negative magnetic field pulse is obtained by supplying a negative current or a reversed current to the corresponding current line. In time section $t_2$, since the negative magnetic field pulse is still maintained, the writing magnetic field 1400b still exists and can offset the extra component of the biased magnetic field 1206. In time section $t_3$, the writing magnetic fields 1400a and 1400b are both positive magnetic field pulses. In time section $t_4$, the writing magnetic field 1400a is negative magnetic field pulse for offsetting the extra component of the biased magnetic field 1206. In time section $t_5$, it is the same as in time section $t_1$, and then during time section $t_6$, supplying of the magnetic field stops.

Figure 17:
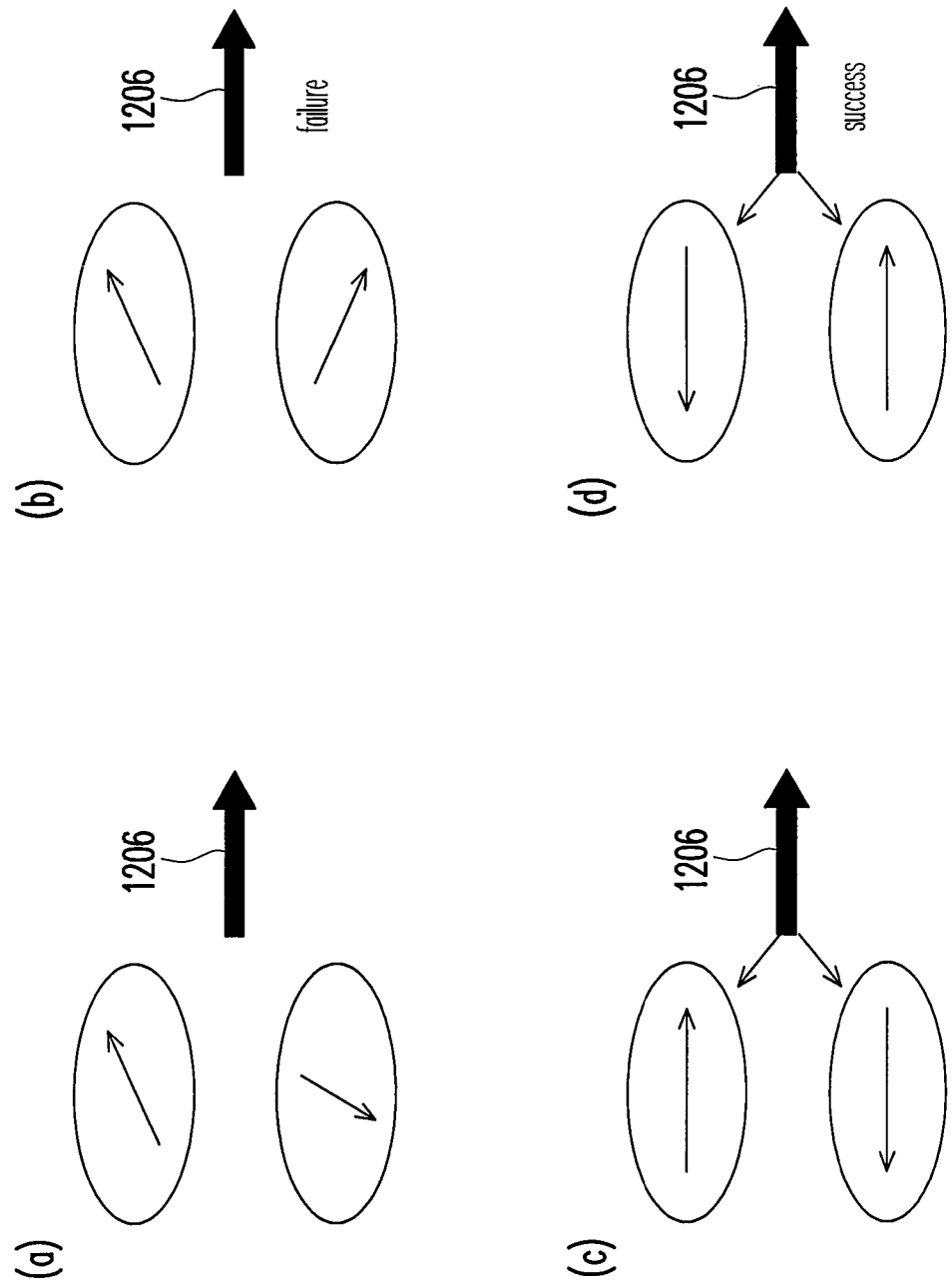
FIG. 17 illustrates that the operating magnetic field can improve operation accuracy according to the present invention.

FIG. 17 illustrates that the operating magnetic field can improve operation accuracy according to the present invention. In FIG. 17, diagram(a) and diagram(b) illustrate the conventional situations, wherein there is no negative magnetic field operation, thus the biased magnetic field 1206 is not offset at the beginning and ending, therefore it causes a failure. Diagram(c) and diagram(d) illustrate the situations in the present invention, wherein since there is the negative magnetic field operation, the biased magnetic field 1206 can be offset at the beginning and ending, accordingly the accuracy of reversing can be effectively increased.

The operating magnetic field as shown in FIG. 16 is mainly to change the content of the memory cell. As to the writing operation in the access operation, the content of the memory cell can be read first during time section $t_1$. If the data to be written is the same as the current data, the subsequent reversing operation is not necessary. If the data to be written is different from the current data, the subsequent reversing operation is performed to change the data content.

In other words, according to the present invention, a reversed magnetic field can be supplied when reading data to at least offset a portion of the biased magnetic field, or to substantially offset the biased magnetic field, so as to increase the reading accuracy.

In overview, according to the present invention, the operating magnetic field in FIG. 16 is provided, and the operation in time section $t_1$, preferably along with the operation in time section $t_6$, allows the biased magnetic field to be increased, so that the writing current can be further reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for accessing data in a magnetic memory, the method being suitable for accessing data in a magnetic memory cell of a magnetic memory device in a toggle mode, wherein the magnetic memory device has a first current line and a second current line, and a positive current passing through the first current line produces a magnetic field in the direction of +45° and a positive current passing through the second current line produces a magnetic field in the direction of −45°, the data accessing method comprising:
   a data changing operation, changing a data stored in the magnetic memory cell, the data changing operation comprising:
      during a first stage, simultaneously supplying a current in a first direction to the first current line and a current in the first direction to the second current line to offset at least a portion of the biased magnetic field; and
   performing a reversing operation to reverse a magnetization of the magnetic free stacked layer.

2. The data accessing method as claimed in claim 1, wherein the reversing operation comprises:
   during a second stage, simultaneously supplying a current in a second direction to the first current line and a current in the first direction to the second current line;
   during a third stage, simultaneously supplying a current in the second direction to the first current line and a current in the second direction to the second current line;
   during a fourth stage, simultaneously supplying a current in the first direction to the first current line and a current in the second direction to the second current line; and
   during a fifth stage, simultaneously supplying a current in the first direction to the first current line and a current in the first direction to the second current line,
   wherein the first direction and the second direction are opposite to each other.

3. The data accessing method as claimed in claim 2, wherein the first direction is a positive current direction or a negative current direction.

4. The data accessing method as claimed in claim 2, wherein the magnetic memory cell is not supplied with an external magnetic field before the first stage and after the fifth stage.

5. The data accessing method as claimed in claim 2, wherein during the fifth stage, a total magnetic field supplied to the magnetic memory cell substantially offsets the biased magnetic field.

6. The data accessing method as claimed in claim 1, wherein during the first stage, a total magnetic field supplied to the magnetic memory cell substantially offsets the biased magnetic field.

7. The data accessing method as claimed in claim 1, wherein in the reversing operation, a current in the first direction is supplied to the first current line and a current in the first direction is simultaneously supplied to the second current line to offset at least a portion of the biased magnetic field during the stage before stopping supplying the magnetic field.

8. A method for accessing data in a magnetic memory, the method being suitable for accessing data in a magnetic memory cell of a magnetic memory device in a toggle mode, wherein the magnetic memory device has a first current line and a second current line, and a positive current passing through the first current line produces a magnetic field in the direction of +45° and a positive current passing through the second current line produces a magnetic field in the direction of −45°, the data accessing method comprises:
   a writing operation, writing a data into the magnetic memory cell, the writing operation comprising:
      during a first stage, simultaneously supplying a current in a first direction to the first current line and a current in the first direction to the second current line;
      reading a current data stored in the magnetic memory cell, wherein if the data to be written is the same as the current data, stop supplying the currents, if the data to be written is different from the current data, continue to following steps:
      during a second stage, simultaneously supplying a current in a second direction to the first current line and a current in the first direction to the second current line;
      during a third stage, simultaneously supplying a current in the second direction to the first current line and a current in the second direction to the second current line;
      during a fourth stage, simultaneously supplying a current in the first direction to the first current line and a current in the second direction to the second current line; and
      during a fifth stage, simultaneously supplying a current in the first direction to the first current line and a current in the first direction to the second current line,
      wherein the first direction and the second direction are opposite to each other.

9. The data accessing method as claimed in claim 8, wherein the first direction is a negative current direction or a positive current direction.

10. The data accessing method as claimed in claim 8, wherein the magnetic memory cell is not supplied with an external magnetic field before the first stage and after the fifth stage.

11. The data accessing method as claimed in claim 8, wherein during the first stage, a total magnetic field supplied to the magnetic memory cell substantially offsets the biased magnetic field.

12. The data accessing method as claimed in claim 8, wherein during the fifth stage, a total magnetic field supplied to the magnetic memory cell substantially offsets the biased magnetic field.

13. A method for accessing data in a magnetic memory, the method being suitable for accessing data in a magnetic memory cell of a magnetic memory device in a toggle mode, wherein the magnetic memory device has a first current line and a second current line, and a positive current passing through the first current line produces a magnetic field in the direction of +45° and a positive current passing through the second current line produces a magnetic field in the direction of −45°, and the magnetic free stacked layer is supplied with a biased magnetic field, the data accessing method comprising:
 a reading operation, reading a data stored in the magnetic memory cell, the reading operation comprising:
 simultaneously supplying a current in a direction to the first current line and a current in the direction to the second current line, wherein a total magnetic field produced by the currents is used for offsetting at least a portion of the biased magnetic field; and
 reading the data presently stored in the magnetic memory cell.

14. The data accessing method as claimed in claim 13, wherein the direction is a negative current direction.

15. The data accessing method as claimed in claim 13, wherein the magnetic memory cell is not supplied with an external magnetic field before supplying the currents.

16. The data accessing method as claimed in claim 13, wherein the total magnetic field substantially offsets the biased magnetic field.

* * * * *